(12) United States Patent
Abe et al.

(10) Patent No.: US 7,141,877 B2
(45) Date of Patent: Nov. 28, 2006

(54) DISPLAY DEVICE AND MANUFACTURING METHOD OF THE SAME

(75) Inventors: Hideaki Abe, Chiba (JP); Makoto Sato, Suzhou (CN); Mitsuru Goto, Chiba (JP)

(73) Assignee: Hitachi Displays, Ltd., Mobara (JP)

( * ) Notice: Subject to any disclaimer, the term of this patent is extended or adjusted under 35 U.S.C. 154(b) by 5 days.

(21) Appl. No.: 11/103,493

(22) Filed: Apr. 12, 2005

(65) Prior Publication Data
US 2005/0242436 A1 Nov. 3, 2005

(30) Foreign Application Priority Data
Apr. 14, 2004 (JP) .............................. 2004-119263

(51) Int. Cl.
*H01L 23/48* (2006.01)
*G02F 1/1345* (2006.01)
(52) U.S. Cl. ............... 257/737; 349/151; 257/E23.021; 257/786
(58) Field of Classification Search ................ 257/737, 257/E23.02, E23.021, E23.069, 738, 763, 257/770, 786; 349/149, 150, 151, 152
See application file for complete search history.

(56) References Cited

U.S. PATENT DOCUMENTS

| 5,739,887 A | * | 4/1998 | Ueda et al. ................. 349/149 |
| 2004/0009303 A1 | * | 1/2004 | Ito et al. ..................... 427/421 |

* cited by examiner

*Primary Examiner*—Minhloan Tran
*Assistant Examiner*—Kristopher Capella
(74) *Attorney, Agent, or Firm*—Antonelli, Terry, Stout and Kraus, LLP.

(57) ABSTRACT

The present invention enhances the mounting accuracy of a drive circuit chip on a substrate thus realizing a display of high quality. Bumps (for example, gold bumps) on the drive circuit chip are used for alignment. Here, to enhance the recognition property of the alignment bumps, a plane shape of a conductive layer which is formed between a semiconductor substrate (Si substrate) of the drive circuit chip and the alignment bump is set to be included within a profile of a plane shape of the alignment bump. That is, by preventing the conductive layer from being observed in a periphery of the alignment bump, it is possible to prevent a photographed pattern of the bump taken by a camera or the like from be influenced by the conductive layer.

20 Claims, 10 Drawing Sheets

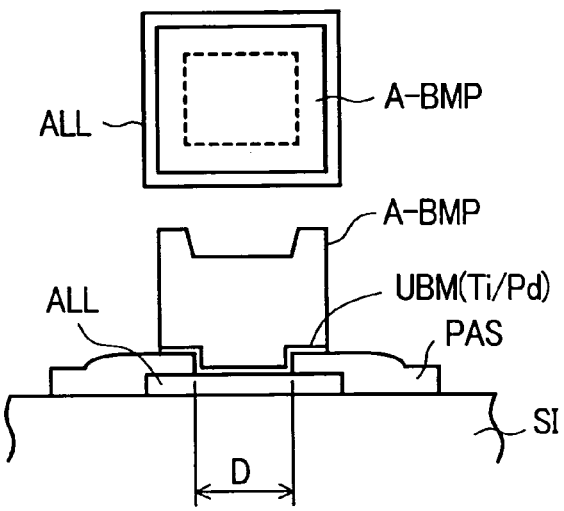
FIG. 1A *Prior Art*
FIG. 1B *Prior Art*
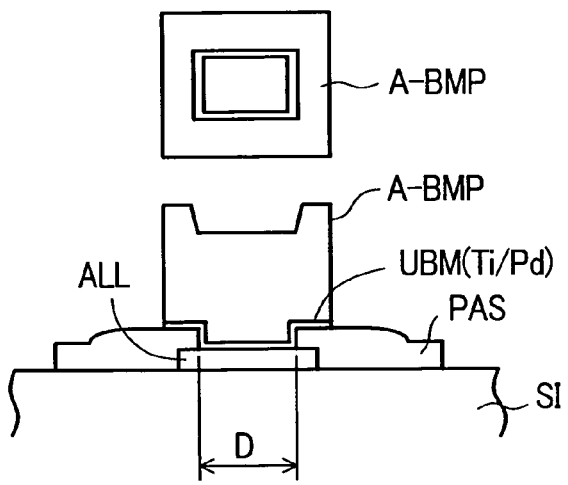
FIG. 2A
FIG. 2B
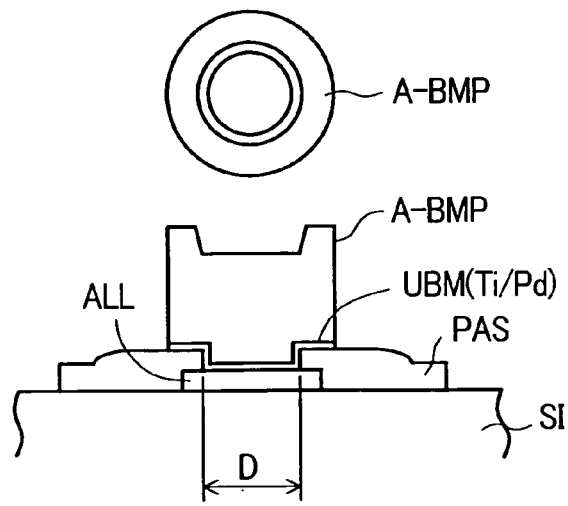
FIG. 3A
FIG. 3B

FIG. 6A  *Prior Art*
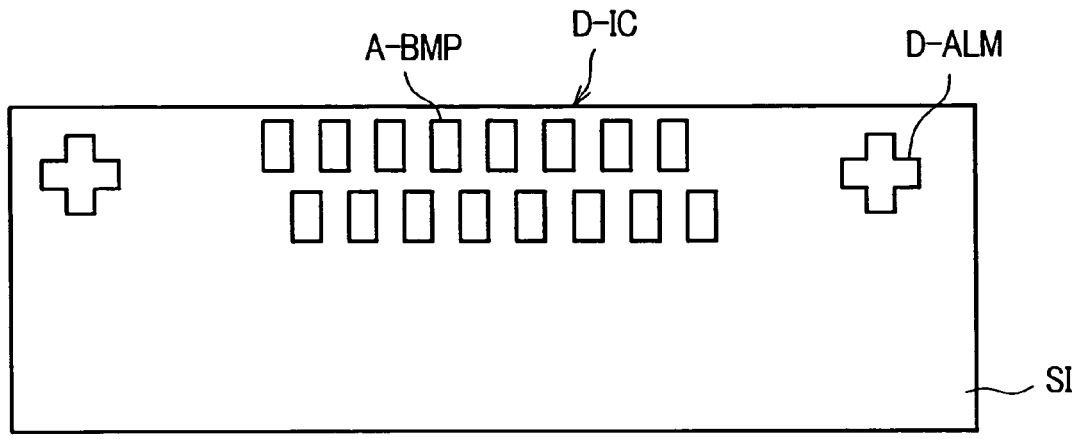
FIG. 6B  *Prior Art*
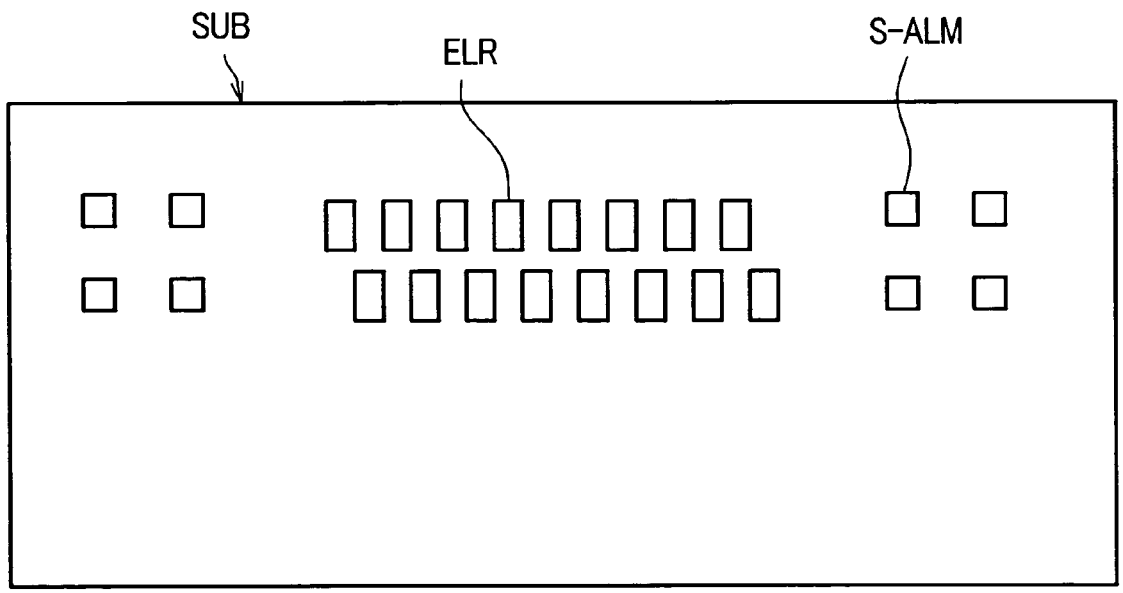
FIG. 6C  *Prior Art*
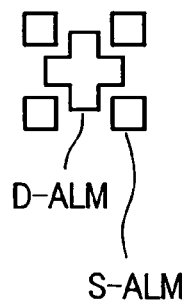

FIG. 7A *Prior Art*
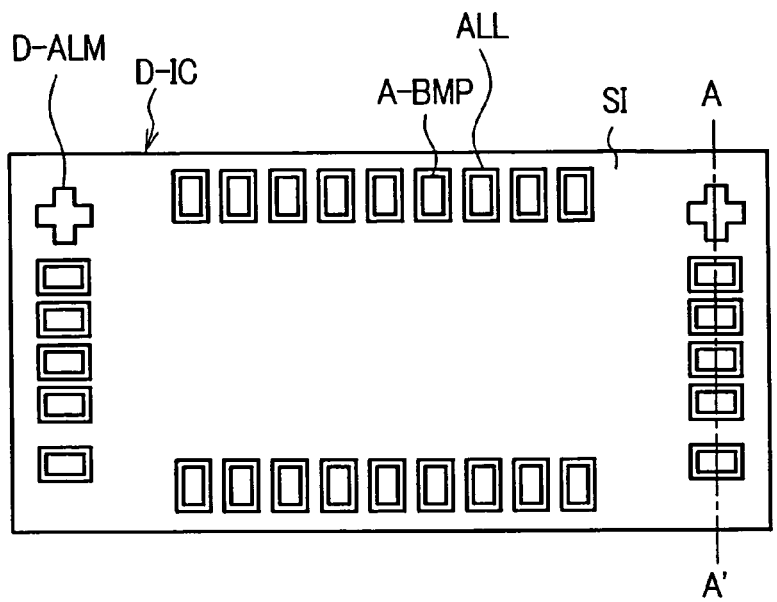
FIG. 7B *Prior Art*
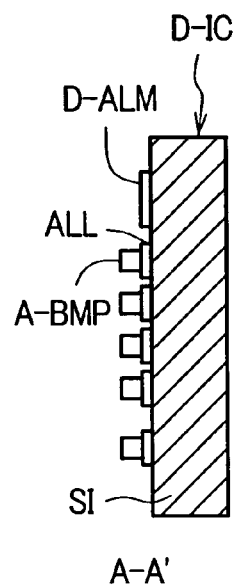
FIG. 8A
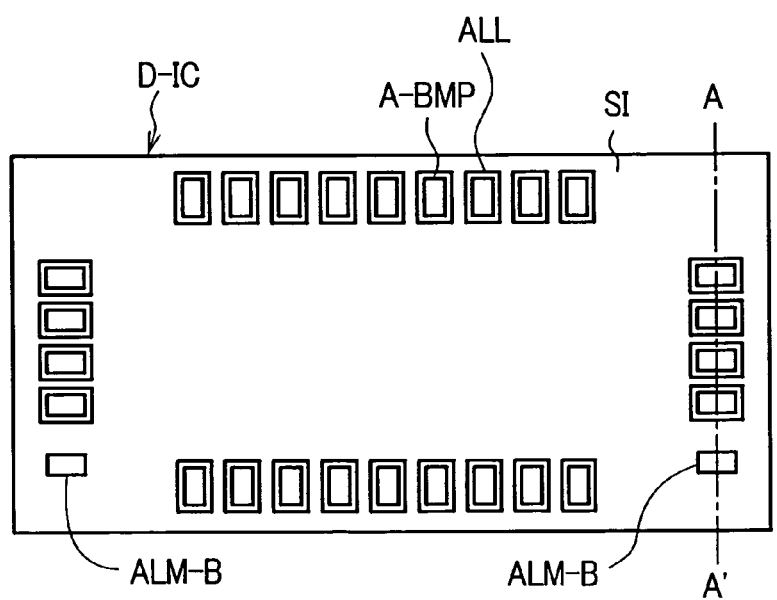
FIG. 8B
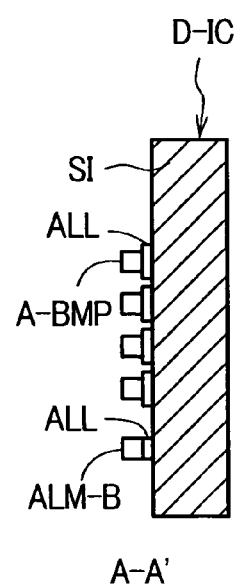

*FIG. 10A* *FIG. 10B*
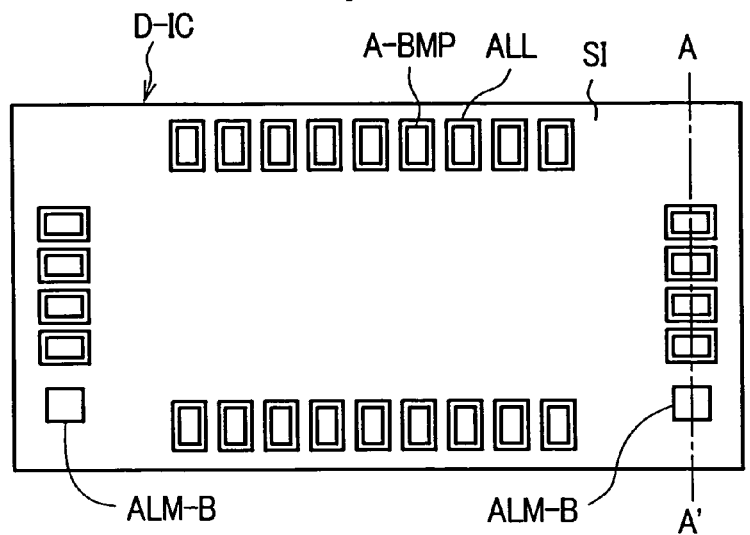
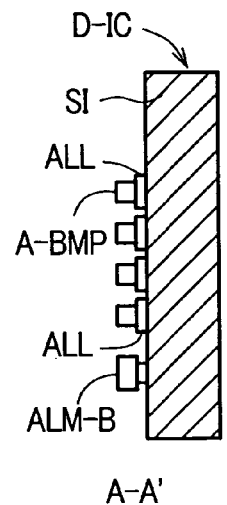
*FIG. 10C*
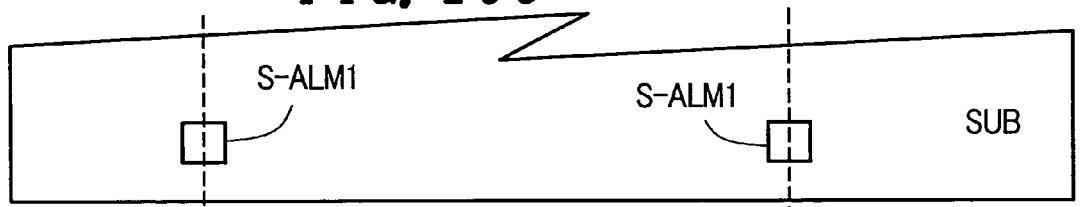
*FIG. 10D*
*FIG. 10E*
*FIG. 10F*
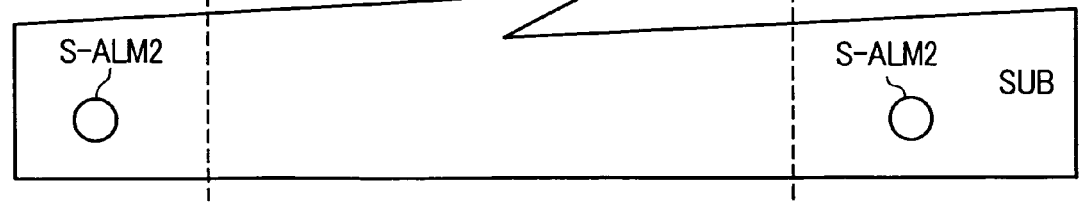

DISPLAY DEVICE AND MANUFACTURING METHOD OF THE SAME

The present application claims priority from Japanese application JP2004-119263 filed on Apr. 14, 2004, the content of which is hereby incorporated by reference into this application.

BACKGROUND OF THE INVENTION

The present invention relates to a flat-panel-type display device using a display panel and a manufacturing method thereof, and is preferably applicable to a display device which mounts a drive circuit chip thereon with high accuracy.

Various types of flat-panel type display devices such as a display device which is capable of performing a high-definition color display for a notebook type computer or a display monitor or a liquid crystal display device which uses a liquid crystal panel, an organic electroluminescence display device (an organic EL display device) which uses electroluminescence (particularly organic electroluminescence) elements or a field emission type display device (FED) which uses field emission elements as a display panel for a mobile phone have been already practically used or have been studied for a practical use thereof.

In the flat-panel-type display device, the above-mentioned drive LSI (also referred to as the drive circuit chip or the driver LSI) for driving pixels is mounted on a periphery of a display region where a large number of pixels are arranged on a transparent insulation substrate made of glass or the like in a matrix array. In the display device of a type which is configured to control the turning on and off of the pixels using thin film transistors, the above-mentioned transparent insulation substrate is also referred to as a thin film transistor (TFT) substrate or an active matrix substrate. In the explanation made hereinafter, the transparent insulation substrate is also referred to as the transparent substrate or simply as the substrate.

In mounting the drive circuit chip on the TFT substrate, it is necessary to align bumps which are conductive projections and constitute connection terminals formed on a back surface (a surface facing the substrate or a side surface) of the drive circuit chip and wiring electrodes formed on the TFT substrate with the high accuracy. Usually, in performing this alignment, alignment marks which are respectively formed on the TFT substrate and the drive circuit chip are aligned to each other and, thereafter, the TFT substrate and the drive circuit chip are fixed to each other using an anisotropic conductive adhesive film (ACF).

SUMMARY OF THE INVENTION

FIG. 1A and FIG. 1B are views for explaining the conventional structure of a bump formed on the drive circuit chip, wherein FIG. 1A is a plan view and FIG. 1B is a cross-sectional view. Since the bump is usually made of gold (Au), the bump is referred to as a gold bump. The gold bump A-BMP is formed such that a background metal layer UBM which is made of a stacked film (Ti/Pd) of titanium and palladium, for example, is formed on a conductive layer ALL (since the layer is usually formed of aluminum (Al), the description of "conductive layer ALL" is used here) which is formed on a Si substrate SI of a drive circuit chip D-IC, and the gold bump A-BMP is formed on the background metal layer UBM. The background metal layer UBM is brought into contact with the conductive layer ALL through an opening formed in a passivation layer PAS which constitutes an insulation layer formed on the Si substrate SI, while the background metal layer UBM is arranged to be brought into contact with the gold bump A-BMP above the passivation film PAS in the periphery of the opening. Further, a plane shape of the conductive layer ALL is set to a size which projects from a plane shape of the gold bump A-BMP.

In this type of drive circuit chip, the alignment mark is formed on the conductive layer ALL and there exists the positional displacement or the misalignment of approximately 5 μm with respect to the positional relationship between the alignment mark and the bump. Then, a profile of the conductive layer ALL which is connected to the gold bump A-BMP is set larger than the shape of the gold bump A-BMP and projects from the gold bump A-BMP. Accordingly, the position measurement of the gold bump is influenced by the profile of the conductive layer ALL thus making the accurate recognition of the position of the gold bump difficult. Accordingly, even when the mounting of the drive circuit chip is performed by aligning the driver circuit chip and the substrate while recognizing the alignment mark, there arises the irregularities of the misalignment of the above-mentioned approximately 5 μm between the gold bumps of the drive circuit chip and the alignment mark. As a result, the mounting accuracy of the drive circuit chip on the substrate is lowered thus giving rise to the degeneration of the display quality.

The present invention has an advantage that the present invention can provide a flat-panel-type display device and a manufacturing method thereof which can realize the high-quality display by enhancing the mounting accuracy of the drive circuit chip.

The present invention uses a bump (for example, a gold bump) of a drive circuit chip for alignment. Here, to enhance the recognition property of the alignment bump, a plane shape of a conductive layer which is formed between a semiconductor substrate (Si substrate) of the drive circuit chip and the alignment bump is configured to be included within a profile of a plane shape of the alignment bump. That is, by preventing the conductive layer from being observed in the periphery of the alignment bump, it is possible to prevent the conductive layer from influencing a photographed pattern of the bump taken by a camera or the like.

To explain representative examples of the present invention disclosed in this specification, they are as follows.

(1) A display device on which a drive circuit chip is mounted, the drive circuit chip includes a semiconductor substrate, an output bump, an alignment bump, and a conductive layer formed of at least one layer, wherein in the conductive layer formed of at least one layer, a plane shape of all conductive layers which are formed between the semiconductor substrate and the alignment bump is included within a profile of a plane shape of the alignment bump, and in the conductive layer formed of at least one layer, a plane shape of at least one conducive layer which is formed between the semiconductor substrate and the output bump is set larger than a profile of a plane shape of the output bump.

(2) In the constitution (1), the conductive layer which is formed between the semiconductor substrate and the alignment bump includes an aluminum layer.

(3) In the constitution (1) or (2), the number of conductive layers which are formed between the semiconductor substrate and the alignment bump is equal to the number of the conductive layers formed between the semiconductor substrate and the output bump.

(4) In the constitution (1), the number of conductive layers which are formed between the semiconductor substrate and the alignment bump is smaller than the number of the conductive layers formed between the semiconductor substrate and the output bump.

(5) In any one of the constitutions (1) to (4), a plane shape of the alignment bump is similar to a plane shape of the output bump.

(6) In any one of the constitutions (1) to (4), a plane shape of the alignment bump differs from a plane shape of the output bump.

(7) In any one of the constitutions (1) to (6), the drive circuit chip is mounted on a substrate of a display panel.

(8) In any one of the constitutions (1) to (6), the drive circuit chip is mounted on a printed circuit board.

(9) In any one of the constitutions (1) to (6), the drive circuit chip is mounted on a flexible printed circuit board.

(10) In any one of the constitutions (1) to (9), the output bump and the alignment bump are formed of a gold bump.

(11) A manufacturing method of a display device on which a drive circuit chip is mounted, wherein the drive circuit chip includes a semiconductor substrate, an output bump, an alignment bump, and a conductive layer formed of at least one layer, in the conductive layer formed of at least one layer, a plane shape of all conductive layers which are formed between the semiconductor substrate and the alignment bump is included within a profile of a plane shape of the alignment bump, and the alignment bump is photographed in a plan to perform the alignment with the substrate on which the drive circuit chip is to be mounted.

(12) In the constitution (11), in the conductive layer formed of at least one layer, a plane shape of at least one conducive layer which is formed between the semiconductor substrate and the output bump is set larger than a profile of a plane shape of the output bump.

(13) In the constitution (11) or (12), the conductive layer which is formed between the semiconductor substrate and the alignment bump includes an aluminum layer.

(14) In any one of the constitutions (11) to (13), the number of conductive layers which are formed between the semiconductor substrate and the alignment bump is equal to the number of the conductive layers formed between the semiconductor substrate and the output bump.

(15) In the constitution (11) or (12), the number of conductive layers which are formed between the semiconductor substrate and the alignment bump is smaller than the number of the conductive layers formed between the semiconductor substrate and the output bump.

(16) In any one of the constitutions (11) to (15), the substrate on which the drive circuit chip is to be mounted is a substrate of a display panel.

(17) In any one of the constitutions (11) to (15), the substrate on which the drive circuit chip is to be mounted is a printed circuit board.

(18) In any one of the constitutions (11) to (15), the substrate on which the drive circuit chip is to be mounted is a flexible printed circuit board.

(19) In any one of the constitutions (11) to (18), the output bump and the alignment bump are formed of a gold bump.

Here, the above-mentioned constitutions merely form one example and the present invention is not limited to the above-mentioned constitutions and various modifications can be made without departing from the technical concept of the present invention.

According to the present invention, the recognition of the profile of the bump of the drive circuit chip is facilitated and hence, at the time of mounting the drive circuit chip on the substrate, it is possible to accurately align the bumps formed on the drive circuit chip and wiring electrodes of the substrate on which the drive circuit chip is mounted (for example, the substrate (for example, TFT substrate) of the display panel, printed circuit board, flexible printed circuit board or the like) whereby it is possible to prevent the deterioration of the display quality attributed to the defective mounting of the drive circuit chip.

BRIEF DESCRIPTION OF THE DRAWING

FIG. 1A and FIG. 1B are views for explaining the conventional structure of a bump formed on a drive circuit chip;

FIG. 2A and FIG. 2B are views for explaining an embodiment 1 of the present invention;

FIG. 3A and FIG. 3B are views for explaining an embodiment 2 of the present invention;

FIG. 6A to FIG. 6C are schematic views for explaining a related art of the alignment between a drive circuit chip and a TFT substrate;

FIG. 7A and FIG. 7B are schematic views for explaining the conventional structure of the gold bump formed on a gold bump forming surface of the drive circuit chip in further detail;

FIG. 8A and FIG. 8B are schematic views for explaining one structural example of the present invention of the gold bump formed on the gold bump forming surface of the drive circuit chip;

FIG. 10A to FIG. 10F are schematic views for explaining still another structural examples of the present invention of the gold bump formed on the gold bump forming surface of the drive circuit chip and various shape examples of the alignment mark on the TFT substrate side;

DETAILED DESCRIPTION OF THE PREFERRED EMBODIMENTS

Figure 4A:
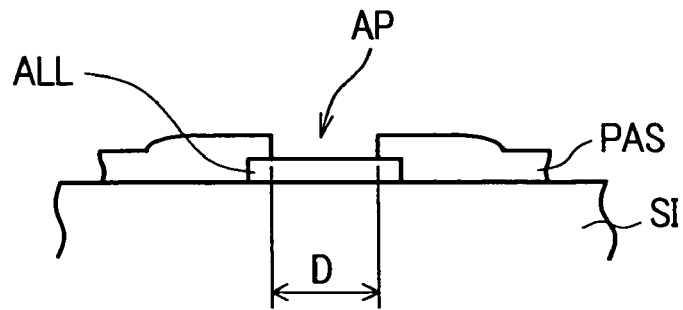
FIG. 4A to FIG. 4D are cross-sectional views of an essential part for explaining a process for forming a gold bump on a drive circuit chip.

Hereinafter, embodiments of the present invention are explained in conjunction with drawings which show the embodiments.

[Embodiment 1]

FIG. 2A and FIG. 2B are views for explaining the embodiment 1 of the present invention, wherein FIG. 2A is a plan view and FIG. 2B is a cross-sectional view. Reference symbols equal to the reference symbols used in FIG. 1A and FIG. 1B correspond to same functional parts. In the present invention, a gold bump A-BMP per se is used as an alignment mark. In this embodiment, the bump which is used as the alignment mark (alignment bump) is formed in a small plane shape (a rectangular shape) such that, as viewed on a plane parallel to a surface of an Si substrate SI, a plane shape of the gold bump A-BMP assumes a rectangular shape and a profile shape of a conductive layer ALL is included within a profile of the gold bump A-BMP. Here, in FIG. 2B, although a background metal layer UBM has the same plane shape (rectangular shape) as the profile of the gold bump A-BMP, this background metal layer UBM may have a small plane shape such that the background metal layer UBM also is included within the profile of the gold bump A-BMP.

That is, in this embodiment, the plane shape of all conductive layers (the conductive layers ALL and the background metal layer UBM) which are formed between the semiconductor substrate (Si substrate SI) and the alignment bump is included within the profile of the plane shape of the alignment bump. Here, "is included within the profile of the plane shape of the alignment bump" implies "does not project from the profile of the plane shape of the alignment bump" and hence, as shown in FIG. 2A and FIG. 2B, this situation includes a case in which the plane shape is smaller than the profile of the gold bump A-BMP as in the case of the conducive layers ALL and a case in which the plane shape is equal to the profile of the gold bump A-BMP as in the case of the background metal layer UBM.

Here, with respect to the input bumps and the output bumps other than the alignment bump, the conductive layers ALL may project from the profile of the gold bump A-BMP. With respect to the input bumps and the output bumps, the conductive layers ALL may be used as the wiring.

In this embodiment, the number of the conductive layers (the conductive layers ALL and the background metal layer UBM) which are formed between the semiconductor substrate (Si substrate SI) and the alignment bump is equal to the number of the conductive layers (the conductive layers ALL and the background metal layer UBM) which are formed between the semiconductor substrate and the output bumps. Due to such a constitution, it is possible to make the output bumps and the alignment bump the same height and hence, the drive circuit chip can be mounted in a stable manner. Further, due to the presence of the conductive layers ALL, the adhesive strength between the gold bump A-BMP and the Si substrate SI is not lowered.

In mounting the drive circuit chip on the TFT substrate, the gold bump A-BMP of the drive circuit chip is photographed with a camera so as to obtain the position data of the gold bump A-BMP and the alignment with the alignment mark formed on the TFT substrate is performed using this data. Here, since the conductive layers ALL are concealed by the gold bump, there is no possibility that the shape of the gold bump A-BMP for alignment influences the acquisition of data.

With the provision of the above-mentioned drive circuit chip having the gold bump A-BMP of the embodiment 1, it is possible to align the wiring electrodes formed on the TFT substrate and the gold bumps A-BMP with high accuracy. Accordingly, it is possible to prevent the deterioration of the display quality attributed to the defective mounting of the drive circuit chip.

[Embodiment 2]

FIG. 3A and FIG. 3B are views for explaining the embodiment 2 of the present invention, wherein FIG. 3A is a plan view and FIG. 3B is a cross-sectional view. Reference symbols equal to the reference symbols used in FIG. 2A and FIG. 2B correspond to same functional parts. In this embodiment, as viewed on a plane parallel to a surface of an Si substrate SI, a planer shape of the gold bump A-BMP assumes a circular shape. Further, a background metal layer UBM and conductive layers ALL formed below the gold bump A-BMP are substantially equal to the background metal layer UBM and the conductive layers ALL of the embodiment 1 except for a point that the background metal layer UBM and the conductive layers ALL have a circular shape in plan.

[Embodiment 3]

Figure 14A:
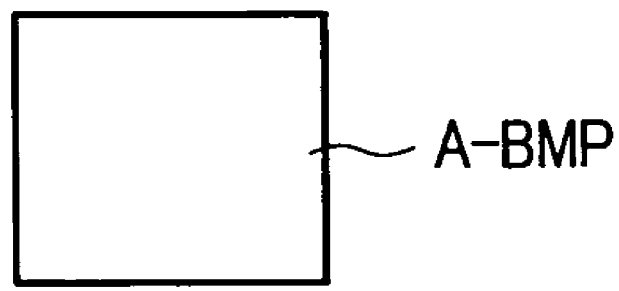
FIG. 14A and FIG. 14B are views for explaining an embodiment 3 of the present invention.
Figure 14B:
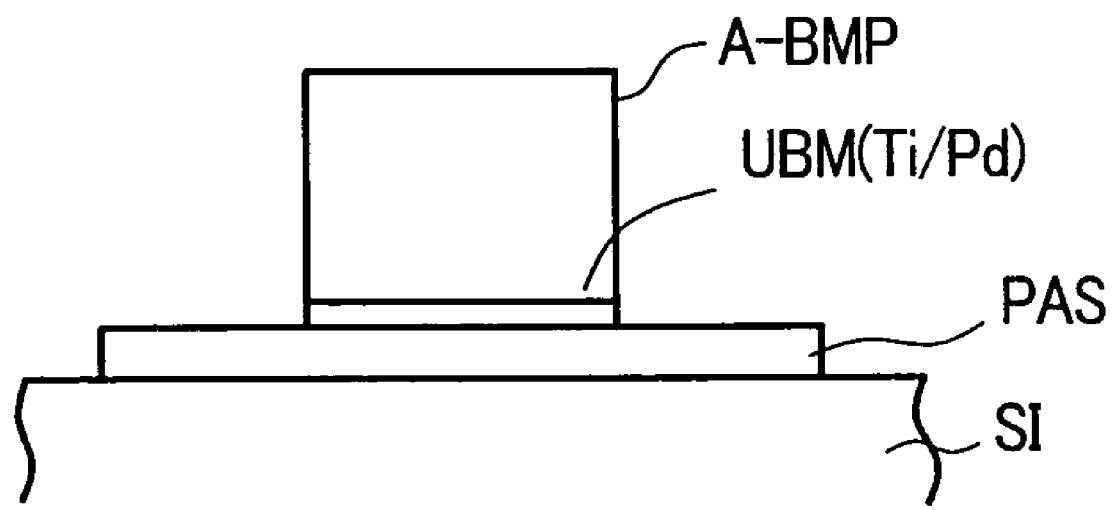

FIG. 14A and FIG. 14B are views for explaining the embodiment 3 of the present invention, wherein FIG. 14A is a plan view and FIG. 14B is a cross-sectional view. Reference symbols equal to the reference symbols used in FIG. 2A and FIG. 2B correspond to same functional parts. This embodiment adopts the structure in which only a background layer UBM is formed below an alignment bump and a conducive layer ALL is not formed. Here, since conductive layers ALL are formed below input bumps and output bumps as usual, in this structure, the number of conductive layers (the background metal layer UBM) formed between the semiconductor substrate (Si substrate SI) and the alignment bump is set smaller than the number of conductive layers (the conductive layers ALL and the background metal layer UBM) formed between the semiconductor substrate (Si substrate SI) and the output bumps. Although a height of the alignment bump becomes lower than a height of the output bumps by approximately 1 μm due to the influence of the structure, there arises no particular drawback provided that the desired stability is ensured when the drive circuit chip is mounted. This influence can be reduced by adopting the suitable arrangement of the bumps. Further, in view of the enhancement of the adhesive strength, instead of directly mounting the gold bumps A-BMP on the passivation film PAS, it is preferable to form the background metal layer UBM between the gold bumps A-BMP and the passivation film PAS.

Next, the manufacturing method of the present invention is explained. First of all, the process for forming the gold bumps in the drive circuit chip is explained in conjunction with FIG. 4A to FIG. 4D and FIG. 5A to FIG. 5C. FIG. 4A to FIG. 4D and FIG. 5A to FIG. 5C are cross-sectional views of an essential part for explaining the process for forming the gold bumps in the drive circuit chip, while FIG. 5A to FIG. 5C show the process which follows the process shown in FIG. 4A to FIG. 4D.

Figure 5A:
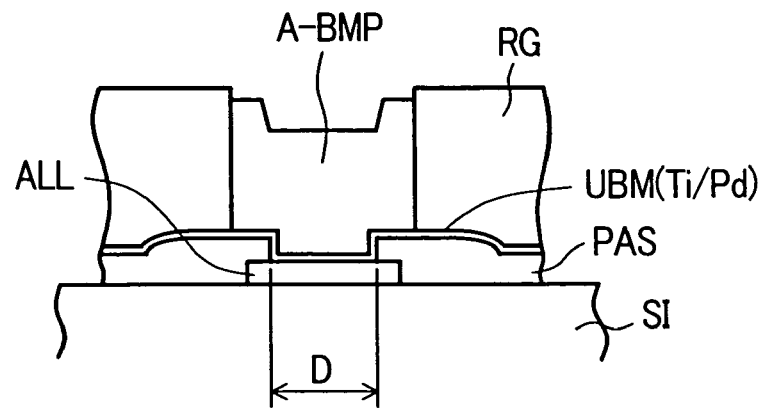
FIG. 5A to FIG. 5C are cross-sectional views of an essential part which follow FIG. 4A to FIG. 4D for explaining a process for forming a gold bump on a drive circuit chip.
Figure 5B:
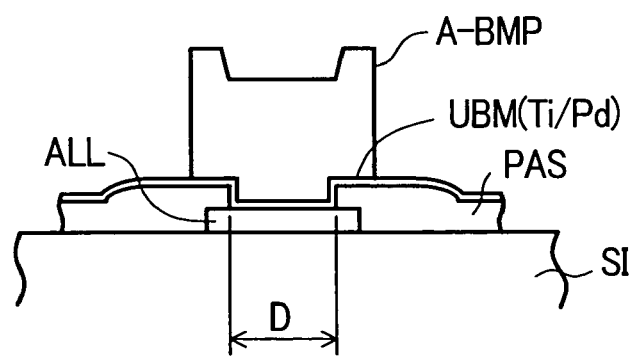
Figure 5C:
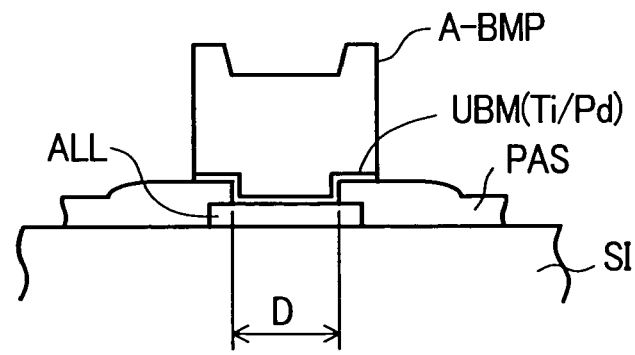

FIG. 4A shows a portion of a back surface of the drive circuit chip before forming the bumps. On a surface of the silicon substrate (Si substrate) SI which constitutes the drive circuit chip, the conductive layer ALL and the passivation film PAS which constitutes an insulation layer covering the periphery of the conductive layer ALL are formed, and an opening AP having an opening size D is formed in the passivation film PAS.

Figure 4B:
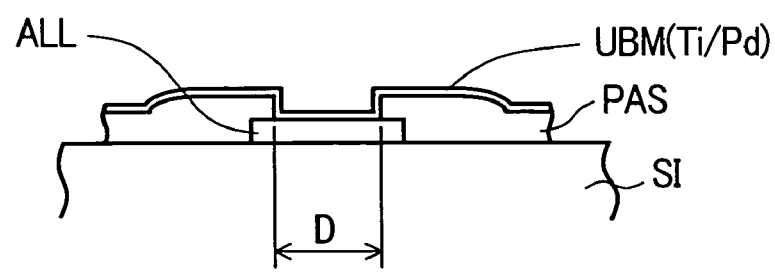
Figure 4C:
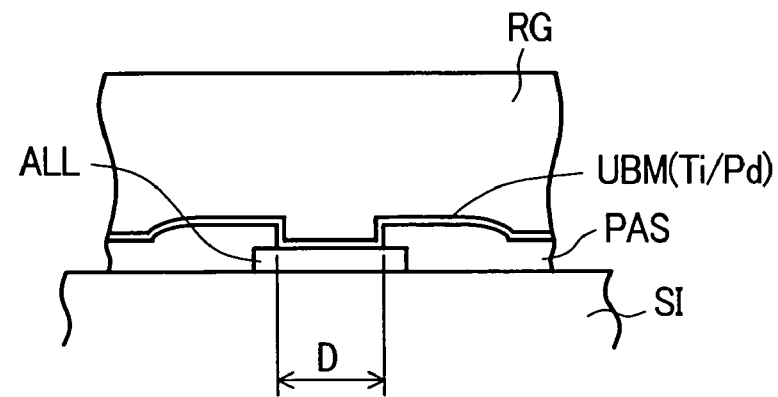

A stacked film (Ti/Pd) made of titanium and palladium is formed as the background metal layer UBM in a state that the background metal layer UBM covers the opening AP and the passivation film PAS shown in FIG. 4A (FIG. 4B).

Figure 4D:
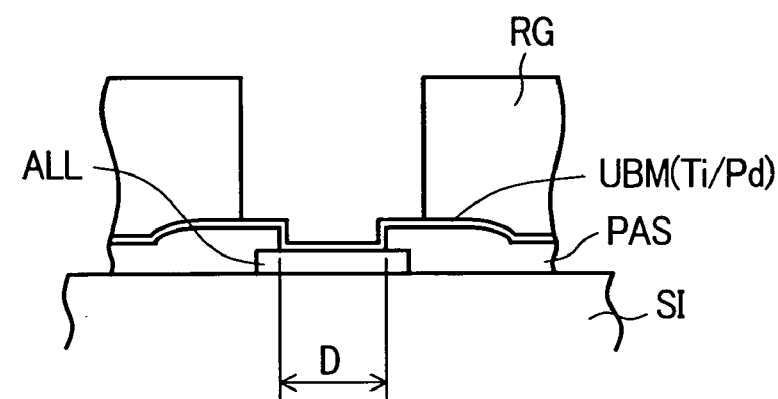

A photosensitive resist RG is applied so as to cover the background metal layer UBM and, thereafter, the exposure and the development are performed using a photo mask thus performing the patterning for forming holes for bumps in the photosensitive resist RG (FIG. 4D).

Gold plating is applied to the holes formed in the photosensitive resist RG thus forming the gold bumps A-BMP (FIG. 5A). Thereafter, the photosensitive resist RG is removed (FIG. 5B), and the background metal layer UBM which is projected to the periphery of the gold bumps A-BMP is removed by etching or the like (FIG. 5c) thus obtaining the drive circuit chip in which the conductive layer ALL is concealed by the gold bumps A-BMP.

Here, in the embodiment 3, the conductive layer ALL may be formed below the gold bumps A-BMP which constitute the input bumps and the output bumps and the conducive layer ALL may not be formed only below the gold bump A-BMP for alignment.

Next, the alignment of the drive circuit chip and the TFT substrate is explained in comparison with the related art. FIG. 6A to FIG. 6C are schematic views for explaining the related art of the alignment of the drive circuit chip and the TFT substrate, wherein FIG. 6A shows a back surface (rear surface) of the drive circuit chip D-IC and FIG. 6B shows a front surface of the TFT substrate. As shown in FIG. 6A, the gold bumps A-BMP are formed on the back surface of the drive circuit chip D-IC. Further, at a given position on the surface on which the gold bumps A-BMP are formed, that is, on the back surface of the drive circuit chip D-IC, that is, at a corner portion on the back surface of the drive circuit chip D-IC, a chip-side alignment mark D-ALM is formed of the conductive layer ALL. The irregularities of the positional relationship between the chip-side alignment mark D-ALM and the gold bumps A-BMP is approximately 5 μm as described above.

On the other hand, as shown in FIG. 6B, on the surface of the TFT substrate SUB, wiring electrodes ELR which are connected with the gold bumps A-BMP of the drive circuit chip D-IC are formed. Further, at a given position on the surface of the TFT substrate SUB, here, at a corner portion of the TFT substrate SUB, a TFT-substrate-side alignment mark S-ALM is formed. Here, the detail of wiring is omitted from the drawings.

In mounting the drive circuit chip D-IC on the TFT substrate SUB, the alignment is performed such that the chip-side alignment mark D-ALM coincides with the TFT-substrate-side alignment mark S-ALM. This alignment state is shown in FIG. 6C.

FIG. 7A and FIG. 7B are schematic views for explaining the conventional structure of the gold bumps on the gold bump forming surface of the drive circuit chip in more details, wherein FIG. 7A is a plan view and FIG. 7B is a cross-sectional view taken along a line A–A' in FIG. 7A. In FIG. 7A and FIG. 7B, all of the bumps formed on the gold bump forming surface are gold bumps A-BMP having the same structure. Here, with respect to the input bumps and the output bumps, the plane shape of the conducive layer ALL which is formed between the bumps and the Si substrate SI projects to the outside from a profile of the gold bump A-BMP. Even when an attempt is made to align the gold bumps A-BMP per se with the wiring electrodes of the TFT substrate using the data which is obtained by photographing the gold bumps A-BMP per se or the data which is obtained by photographing the drive-circuit-chip-side alignment mark D-ALM, as mentioned above, the acquisition of the accurate positional data of the gold bumps A-BMP is difficult.

FIG. 8A and FIG. 8B are schematic views for explaining one structural example of the present invention of the gold bumps formed on the gold bump forming surface of the drive circuit chip, wherein FIG. 8A is a plan view and FIG. 8B is a cross-sectional view taken along a line A–A' in FIG. 8A. In FIG. 8A and FIG. 8B, symbols equal to the symbols used in FIG. 7A and FIG. 7B correspond to identical functional parts. In this structural example, the structure of a part of the bumps formed on the gold bump forming surface is made different from the structure of other bumps. Here, each gold bump which is formed on short sides of the drive circuit chip D-IC is used as an alignment bump ALM-B or alignment dedicated bump.

The alignment bump ALM-B is, as can be clearly understood from FIG. 8A and FIG. 8B particularly, set to a size such that the conductive layer ALL which is interposed between the alignment bump ALM-B and the Si substrate SI does not project from a profile shape of the alignment bump ALM-B. The profile shape of the alignment bump ALM-B is set to have the same shape and size as other input and output gold bumps ALM-B. Here, although omitted from the drawing, the background metal layer UBM has the same shape as the gold bump A-BMP and hence, there arises no particular drawback. Although the wiring may be formed using the conductive layer ALL when necessary, the wiring is omitted from the drawing.

With the provision of such a structural example, it is possible to provide the accurate shape recognition of the alignment bumps ALM-B and hence, the accuracy of alignment between the gold bumps A-BMP (and the alignment bump ALM-B) on the drive circuit chip D-IC and the wiring electrodes ELR on the TFT substrate SUB can be enhanced whereby it is possible to prevent the deterioration of the display quality attributed to the defective mounting of the drive circuit chip while ensuring the stable connection quality.

Figure 9A:
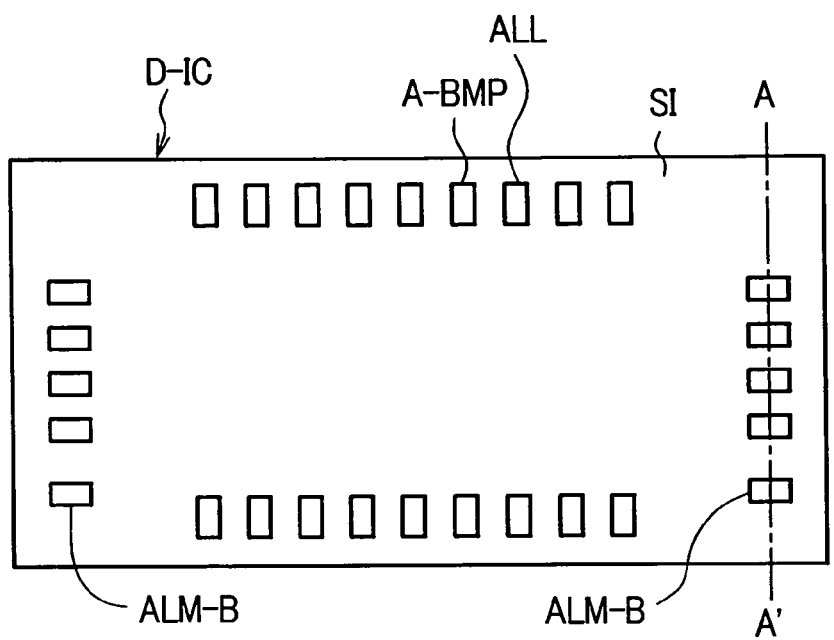
FIG. 9A and FIG. 9B are schematic views for explaining another structural example of the present invention of the gold bump formed on the gold bump forming surface of the drive circuit chip.
Figure 9B:
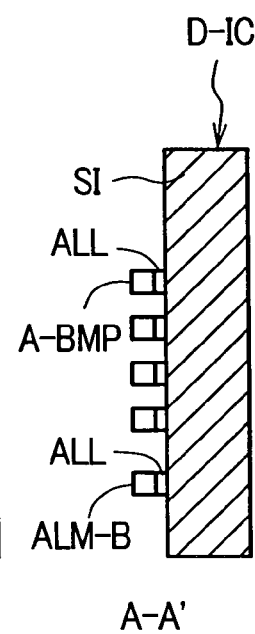

FIG. 9A and FIG. 9B are schematic views for explaining another structural example of the present invention of the gold bumps formed on the gold bump forming surface of the drive circuit chip, wherein FIG. 9A is a plan view and FIG. 9B is a cross-sectional view taken along a line A–A' in FIG. 9A. In FIG. 9A and FIG. 9B, reference symbols equal to the reference symbols used in FIG. 7A and FIG. 7B and FIG. 8A and FIG. 8B correspond to identical functional parts. In this structural example, a plane shape of conductive layers ALL which are formed between gold bumps A-BMP and alignment bumps ALM-B which constitute all bumps formed on the gold bump forming surface and the Si substrate SI is set to a size which prevents the plane shape from projecting from a profile shape of the gold bumps A-BMP, ALM-B.

Due to the provision of such a structural example, in addition to the advantageous effects substantially equal to the advantageous effects obtained by the previously-mentioned structural example, it is also possible to obtain an advantageous effect that any bumps can be used as alignment bumps and hence, the accuracy of alignment between wiring electrodes ELR on the TFT substrate SUB and the bumps can be enhanced whereby it is possible to prevent the deterioration of the display quality attributed to the defective mounting of the drive circuit chip while ensuring the stable connection quality.

FIG. 10A to FIG. 10F are schematic views for explaining still another structural example of the present invention of the gold bumps formed on the gold bump forming surface of the drive circuit chip and various shape examples of TFT-substrate-side alignment marks. In these drawings, FIG. 10A is a plan view of the gold bump forming surface of the drive circuit chip, FIG. 10B is a cross-sectional view taken along a line A–A' in FIG. 10A, FIG. 10C is a plan view of an essential part for explaining a first example of the TFT-substrate-side alignment marks, FIG. 10D is a plan view of an essential part for explaining a second example of the TFT-substrate-side alignment marks, FIG. 10E is a plan view of an essential part for explaining a third example of the TFT-substrate-side alignment marks, and FIG. 10F is a plan view of an essential part for explaining a fourth example of the TFT-substrate-side alignment marks.

As shown in FIG. 10A and FIG. 10B, out of gold bumps formed on the drive circuit chip of this structural example, a plane shape of the alignment bumps ALM-B is made different from a plane shape of other input and output bumps A-BMP. Further, a conductive layer ALL which is interposed between the alignment bump ALM-B and the TFT substrate SUB is set to a size which prevents the conductive layer ALL from projecting from a profile of a plane shape of the bump A-BMP. Here, the plane shape of the alignment bump ALM-B is assumed to be a square. The plane shape of other input or output bumps A-BMP is formed in a rectangular shape. Here, although not shown in the drawings, the plane shape of the alignment bump ALM-B and the plane shape of other input and output bumps A-BMP may be similar but in different size.

On the other hand, the TFT-substrate-side alignment mark which is formed on the TFT substrate SUB for being aligned with the alignment bumps ALM-B of the drive circuit chip D-IC can be formed as shown in FIG. 10C to FIG. 10F, for example. In FIG. 10C, at positions which correspond to the alignment bumps ALM-B of the drive circuit chip D-IC, alignment marks S-ALM1 having a plane shape equal to a plane shape of the bumps ALM-B are formed.

In FIG. 10D, at positions which correspond to the alignment bumps ALM-B of the drive circuit chip D-IC, alignment marks S-ALM2 having a plane shape different from a plane shape of the bumps ALM-B are formed. In FIG. 10E, at positions which do not correspond to and hence are different from the positions of the alignment bumps ALM-B of the drive circuit chip D-IC, alignment marks S-ALM1 having a plane shape equal to a plane shape of the bumps ALM-B are formed. Further, In FIG. 10F, at positions which do not correspond to and hence are different from the positions of the alignment bumps ALM-B of the drive circuit chip D-IC, alignment marks S-ALM2 having a plane shape different from a plane shape of the bumps ALM-B are formed.

In the alignment using the alignment bumps ALM-B of the drive circuit chip D-IC in FIG. 10A and FIG. 10B and the TFT-substrate-side alignment marks S-ALM1, S-ALM2 shown in FIG. 10C and FIG. 10D, a stage is moved to perform the alignment such that the data of the alignment bumps ALM-B of the drive circuit chip D-IC which is obtained by photographing with a camera and the data of the TFT-substrate side alignment marks S-ALM1, S-ALM2 which is obtained by photographing with a camera coincide with each other.

Further, in the alignment using the alignment bumps ALM-B of the drive circuit chip D-IC in FIG. 10A and FIG. 10B and the TFT-substrate-side alignment marks S-ALM1, S-ALM2 shown in FIG. 10E and FIG. 10F, a mounting machine which mounts the drive circuit chip D-IC thereon, a stage which mounts the TFT substrate thereon or both of the mounting machine and the stage are moved such that the data of the alignment bumps ALM-B of the drive circuit chip D-IC which is obtained by photographing with the camera and the data of the TFT-substrate side alignment bumps S-ALM1, S-ALM2 which is obtained by photographing with the camera assume a given relationship.

Figure 11:
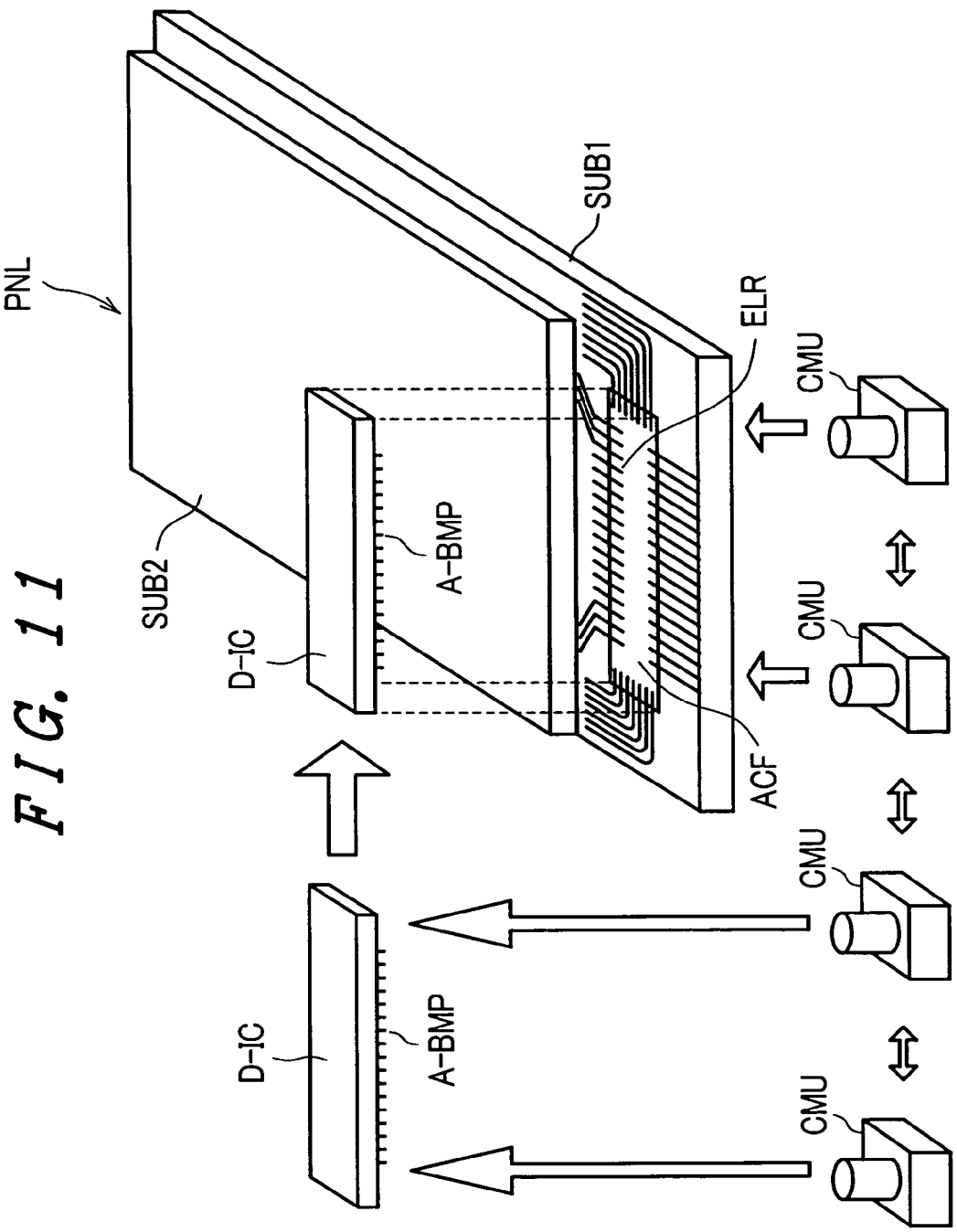
FIG. 11 is a view for explaining an alignment method at the time of mounting the drive circuit chip on the TFT substrate.

FIG. 11 is a view for explaining an alignment method at the time of mounting the drive circuit chip on a TFT substrate. In FIG. 11, the explanation is made by taking a liquid crystal display panel PNL as an example. The liquid crystal display panel PNL is configured such that a liquid crystal layer (not shown in the drawing) is hermetically filled in a lamination gap defined between the TFT substrate SUB1 and a color filter substrate SUB2. The TFT substrate SUB1 has a size which allows at least one side of the TFT substrate SUB1 to project from the color filter substrate SUB2 and wiring electrodes ELR are formed on a main surface of the projecting portion. On the wiring electrodes ELR, a drive circuit chip D-IC is mounted in a state that gold bumps A-BMP thereof are connected with the wiring electrodes ELR. Here, the drive circuit chip D-IC is adhered to and fixed to the TFT substrate SUB1 by an anisotropic conductive film ACF.

In the alignment at the time of mounting the drive circuit chip on the TFT substrate, a camera unit CMU is used. The TFT substrate SUB1 is mounted on an X-Y stage, while the drive circuit chip D-IC is mounted on a mounting machine. First of all, two alignment bumps ALM-B (or input or output bumps equivalent to the two alignment bumps ALM-B) of the drive circuit chip D-IC are photographed by the camera CMU so as to acquire positional data thereof. Next, two alignment marks S-ALM1 (or S-ALM2) at two portions of the TFT substrate SUB1 are photographed by the camera CMU so as to acquire positional data thereof.

Then, the X-Y stage, the mounting machine or both of the X-Y stage and the mounting machine are moved so that the data of the alignment bumps ALM-B of the drive circuit chip D-IC and the data of the alignment mark of the TFT substrate SUB1 coincide with each other or assume a given relationship. Here, to a drive circuit chip D-IC mounting region of the TFT substrate SUB1, an anisotropic conductive film ACF having an adhesive property is laminated. When the alignment bumps ALM-B of the drive circuit chip D-IC coincide with the given positions of the TFT substrate SUB1, the drive circuit chip D-IC is pressed to the TFT substrate SUB1 so as to adhere and fix the drive circuit chip D-IC to the TFT substrate SUB1.

Due to such an alignment, the input and output gold bumps A-BMP of the drive circuit chip D-IC are aligned with the wiring electrodes ELR of the TFT substrate SUB1 with high accuracy. Here, when the TFT substrate SUB1 is formed of a transparent substrate, the photographing is performed from below using the camera unit CMU, while when the TFT substrate SUB1 is formed of an opaque substrate, the photographing is performed from above using the camera unit CMU.

The shape of the alignment gold bumps which have been explained heretofore may be a rectangular shape including a square shape and an elongated quadrangular shape, a circular shape or an elliptical shape (an oval shape). Further, assuming the shape of the profile shape of the gold bumps as the square shape and setting the size of profile size as 60 μm×60 μm×60 μm, it is desirable to set the size of the conductive layer ALL as approximately 50 μm×50 μm. However, the conductive layer ALL may have any size provided that the conductive layer ALL does not project from the profile of the gold bump due to the positional displacement between the gold bump and the conductive layer ALL.

Figure 12:
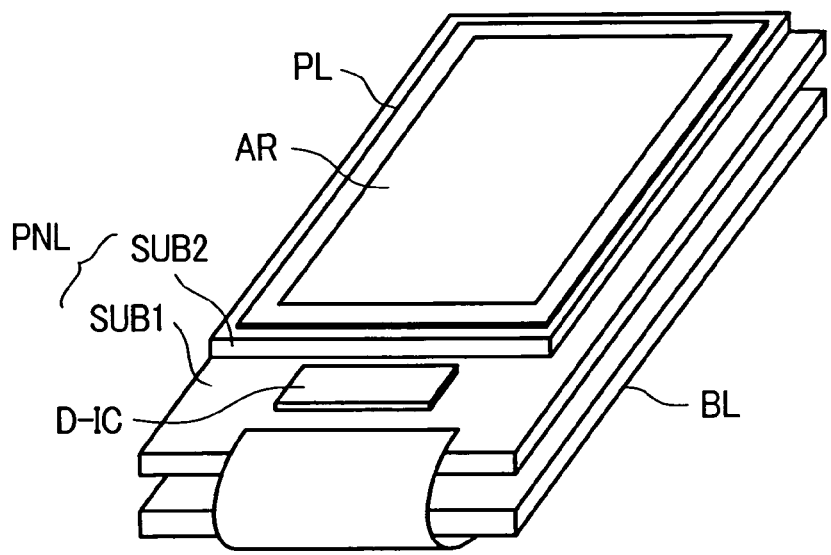
FIG. 12 is a perspective view for explaining one example of a liquid crystal module for a mobile telephone to which the mounting of the drive circuit chip of the present invention is applied.

FIG. 12 is a perspective view for explaining one example of a liquid crystal display module for a mobile phone to which the drive circuit chip mounting of the present invention is applied. The liquid crystal display module is constituted by installing a backlight BL on a back surface of a liquid crystal display panel PNL which is constituted of a TFT substrate SUB1 and a color filter substrate SUB2. A drive circuit chip D-IC is mounted on the TFT substrate SUB1. Further, a polarizer PL is laminated to a front surface of a display region AR of the color filter substrate SUB2.

Signals and drive voltages for display are supplied to the drive circuit chip D-IC from a signal processing printed circuit board (not shown in the drawing) which is mounted on a back surface of the backlight BL via a flexible printed circuit board FPC.

Here, the present invention is also applicable to a reflective-type liquid crystal display device which includes a front light.

Figure 13:
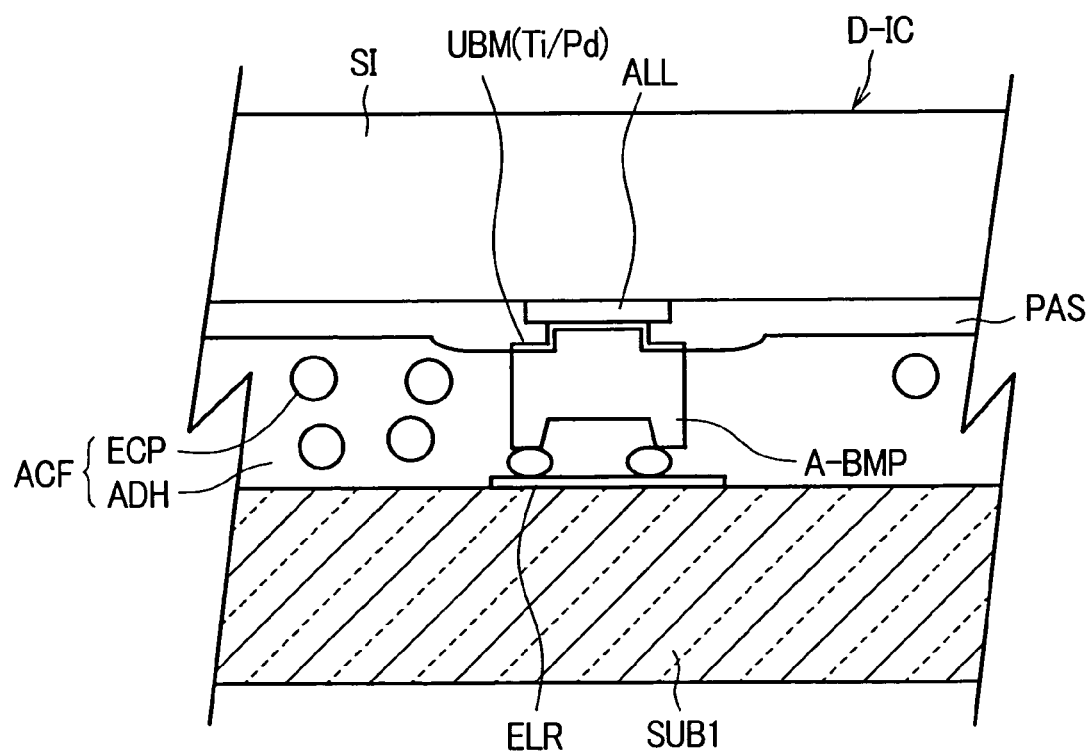
FIG. 13 is a schematic cross-sectional view for explaining a state in which a drive circuit chip D-IC is mounted on a TFT substrate SUB1.

FIG. 13 is a schematic cross-sectional view for explaining a mounting state of the drive circuit chip D-IC on the TFT substrate SUB1. The wiring electrode ELR is formed on the TFT substrate SUB1 and the gold bump A-BMP which has been explained in the above-mentioned embodiment is formed on the back surface of the Si substrate SI of the drive circuit chip D-IC. The gold bump A-BMP is conductively connected to the wiring electrode ELR with conductive particles ECP which are contained in the anisotropic conductive film ACF. Here, reference symbol ADH indicates an adhesive agent which is one of constitutional elements of the anisotropic conductive film.

The display device of the present invention is not limited to the liquid crystal display device and is applicable to the mounting of the drive circuit chip on other display panel such as the organic EL display device, the FED display device and the like. Further, the substrate on which the drive circuit chip D-IC is mounted is not limited to the substrate of the display panel and the substrate may be a printed circuit board or a flexible printed circuit board. Further, the present invention is not limited to the display device and is applicable to all electronic equipment. Further, the respective embodiments which have been explained heretofore may be combined in two or more provided that these embodiments do not conflict each other.

What is claimed is:

1. A display device mounting a drive circuit chip thereon, the drive circuit chip comprising:
   a semiconductor substrate;
   an output bump;
   an alignment bump; and
   a conductive layer formed of at least one layer, wherein
   in the conductive layer formed of at least one layer, a plane shape of all conductive layers which are formed between the semiconductor substrate and the alignment bump is included within a profile of a plane shape of the alignment bump, and
   in the conductive layer formed of at least one layer, a plane shape of at least one conductive layer which is formed between the semiconductor substrate and the output bump is set larger than a profile of a plane shape of the output bump.

2. A display device according to claim 1, wherein the conductive layer which is formed between the semiconductor substrate and the alignment bump includes an aluminum layer.

3. A display device according to claim 1, wherein the number of conductive layers which are formed between the semiconductor substrate and the alignment bump is equal to the number of the conductive layers formed between the semiconductor substrate and the output bump.

4. A display device according to claim 1, wherein the number of conductive layers which are formed between the semiconductor substrate and the alignment bump is smaller than the number of the conductive layers formed between the semiconductor substrate and the output bump.

5. A display device according to claim 1, wherein a plane shape of the alignment bump is similar to a plane shape of the output bump.

6. A display device according to claim 1, wherein a plane shape of the alignment bump differs from a plane shape of the output bump.

7. A display device according to claim 1, wherein the drive circuit chip is mounted on a substrate of a display panel.

8. A display device according to claim 1, wherein the drive circuit chip is mounted on a printed circuit board.

9. A display device according to claim 1, wherein the drive circuit chip is mounted on a flexible printed circuit board.

10. A display device according to claim 1, wherein the output bump and the alignment bump are formed of a gold bump.

11. A manufacturing method of a display device on which a drive circuit chip is mounted, wherein
    the drive circuit chip includes a semiconductor substrate, an output bump, an alignment bump, and a conductive layer formed of at least one layer,
    in the conductive layer formed of at least one layer, a plane shape of all conductive layers which are formed between the semiconductor substrate and the alignment bump is included within a profile of a plane shape of the alignment bump, and
    the alignment bump enables performance of the alignment with a substrate on which the drive circuit chip is to be mounted.

12. A manufacturing method of a display device according to claim 11, wherein in the conductive layer formed of at least one layer, a plane shape of at least one conducive layer which is formed between the semiconductor substrate and the output bump is set larger than a profile of a plane shape of the output bump.

13. A manufacturing method of a display device according to claim 11, wherein the conductive layer which is formed between the semiconductor substrate and the alignment bump includes an aluminum layer.

14. A manufacturing method of a display device according to claim 11, wherein the number of conductive layers which are formed between the semiconductor substrate and the alignment bump is equal to the number of the conductive layers formed between the semiconductor substrate and the output bump.

15. A manufacturing method of a display device according to claim 11, wherein the number of conductive layers which are formed between the semiconductor substrate and the alignment bump is smaller than the number of the conductive layers formed between the semiconductor substrate and the output bump.

16. A manufacturing method of a display device according to claim 11, wherein the substrate on which the drive circuit chip is to be mounted is a substrate of a display panel.

17. A manufacturing method of a display device according to claim 11, wherein the substrate on which the drive circuit chip is to be mounted is a printed circuit board.

18. A manufacturing method of a display device according to claim 11, wherein the substrate on which the drive circuit chip is to be mounted is a flexible printed circuit board.

19. A manufacturing method of a display device according to claim 11, wherein the output bump and the alignment bump are formed of a gold bump.

20. A manufacturing method of a display device according to claim 11, wherein the alignment bump is photographed in a plan to enable the performance of the alignment with the substrate.

* * * * *